United States Patent
Nomura

(10) Patent No.: US 9,831,226 B2
(45) Date of Patent: Nov. 28, 2017

(54) OPTICAL COUPLING DEVICE, MANUFACTURING METHOD THEREOF, AND POWER CONVERSION SYSTEM

(71) Applicant: Renesas Electronics Corporation, Tokyo (JP)

(72) Inventor: Yukio Nomura, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 14/941,719

(22) Filed: Nov. 16, 2015

(65) Prior Publication Data

US 2016/0245996 A1 Aug. 25, 2016

(30) Foreign Application Priority Data

Feb. 25, 2015 (JP) ................. 2015-035604

(51) Int. Cl.
G02B 6/12 (2006.01)
H01L 25/16 (2006.01)
H01L 33/54 (2010.01)

(52) U.S. Cl.
CPC ............ *H01L 25/167* (2013.01); *H01L 33/54* (2013.01); *H01L 2224/48247* (2013.01); *H01L 2924/181* (2013.01)

(58) Field of Classification Search
CPC ...... G02B 6/12002; G02B 6/13; G02B 6/138; G02B 2006/12061; G02B 2006/12073; G02B 2006/12147
USPC .......................................................... 385/14
See application file for complete search history.

(56) References Cited

U.S. PATENT DOCUMENTS

| 6,170,996 B1 * | 1/2001 | Miura | G02B 6/4204 385/88 |
| 8,044,128 B2 * | 10/2011 | Sawada | C08G 59/3236 524/147 |
| 8,237,189 B2 * | 8/2012 | Taguchi | C08L 63/00 257/100 |
| 8,787,723 B2 * | 7/2014 | Makino | C08F 283/065 385/143 |
| 8,846,420 B2 * | 9/2014 | Shiobara | H01L 33/486 438/113 |
| 8,909,010 B2 * | 12/2014 | Kimura | G02B 6/4214 385/49 |

(Continued)

FOREIGN PATENT DOCUMENTS

| JP | 2005-239901 A | 9/2005 |
| JP | 2008-189833 A | 8/2008 |
| JP | 2014-033124 A | 2/2014 |

*Primary Examiner* — Ryan Lepisto
*Assistant Examiner* — Guy Anderson
(74) *Attorney, Agent, or Firm* — Mattingly & Malur, PC

(57) ABSTRACT

In order to improve properties, an optical coupling device has a potting resin and an internal mold resin between a light emitting element and a light receiving element. The internal mold resin is a cured product of a composition having an epoxy resin and a curing agent, and is a resin having a light transmission property. Additionally, the internal mold resin MRI contains an aromatic ring and an alicyclic compound. By thus lowering the ratio of an aromatic ring in the epoxy resin, deterioration of the resin can be suppressed. Thereby, a decrease in the light transmission property of the epoxy resin cured product can be suppressed, and degradation of the transmission performance for an optical signal can be reduced.

17 Claims, 13 Drawing Sheets

(56) References Cited

U.S. PATENT DOCUMENTS

| | | | | |
|---|---|---|---|---|
| 9,303,115 B2* | 4/2016 | Hayashi | .............. | C08G 59/186 |
| 2001/0026665 A1* | 10/2001 | Ando | .................... | G02B 6/4201 |
| | | | | 385/94 |
| 2004/0061433 A1* | 4/2004 | Izuno | ................ | H01L 21/76251 |
| | | | | 313/498 |
| 2005/0029633 A1* | 2/2005 | Yumura | ............... | H01L 25/167 |
| | | | | 257/666 |
| 2008/0247703 A1* | 10/2008 | Kodama | ............. | G02B 6/4204 |
| | | | | 385/14 |
| 2008/0255283 A1* | 10/2008 | Aoki | ..................... | H01L 23/293 |
| | | | | 524/300 |
| 2009/0016671 A1* | 1/2009 | Asai | ......................... | G02B 6/43 |
| | | | | 385/14 |
| 2011/0054072 A1* | 3/2011 | Sawada | ............. | C08G 59/3236 |
| | | | | 523/353 |
| 2012/0076468 A1* | 3/2012 | Makino | ............... | C08F 283/065 |
| | | | | 385/142 |
| 2012/0275747 A1* | 11/2012 | Kimura | ................ | G02B 6/4214 |
| | | | | 385/49 |
| 2013/0158167 A1* | 6/2013 | Takenaka | ............. | H01L 23/293 |
| | | | | 523/456 |
| 2014/0159062 A1* | 6/2014 | Nomura | ............. | H01L 23/4952 |
| | | | | 257/84 |
| 2015/0262986 A1* | 9/2015 | Takai | .................... | H01L 25/162 |
| | | | | 257/82 |

* cited by examiner

160°C ~ 180°C

25°C

OPTICAL COUPLING DEVICE, MANUFACTURING METHOD THEREOF, AND POWER CONVERSION SYSTEM

CROSS-REFERENCE TO RELATED APPLICATIONS

The disclosure of Japanese Patent Application No. 2015-035604 filed on Feb. 25, 2015 including the specification, drawings and abstract is incorporated herein by reference in its entirety.

BACKGROUND

The present invention relates to an optical coupling device, a manufacturing method thereof, and a power conversion system.

A photocoupler has a light emitting element, such as a light emitting diode, and a light receiving element, such as a phototransistor, and transmits an electrical signal by converting an inputted electrical signal into light with the light emitting element and by returning the light to the electrical signal with the light receiving element.

A photocoupler is disclosed, for example, in Japanese Unexamined Patent Application Publication No. 2008-189833 (Patent Document 1), in which a light emitting element and a light receiving element are sealed by a cured product of a thermosetting epoxy resin composition.

Also, a photocoupler using a primary sealing resin and a secondary sealing resin is disclosed in Japanese Unexamined Patent Application Publication No. 2014-33124 (Patent Document 2). The primary sealing resin contains an epoxy resin for primary sealing, a phenolic resin curing agent for primary sealing, an inorganic filler for primary sealing, and fatty acid wax for primary sealing; and the secondary sealing resin contains an epoxy resin for secondary sealing, a phenolic resin curing agent for secondary sealing, an inorganic filler for secondary sealing, and fatty acid wax for secondary sealing. At least one of the resin for primary sealing and the resin for secondary sealing contains fatty acid amide wax.

Also, an optical semiconductor device sealed by a cured product of an epoxy resin composition is disclosed in Japanese Unexamined Patent Application Publication No. 2005-239901 (Patent Document 3). The epoxy resin composition is one whose main components are an epoxy resin (A) having two or more epoxy groups in one molecule, a phenolic resin curing agent (B), a curing accelerator (C), and fused crushed silica (D). The epoxy resin composition further contains a phenolic antioxidant (E) as an essential component. Additionally, the light transmittance of a cured product of the epoxy resin composition, the product having a thickness of 1 mm, is 15% or more for the light having a wavelength of from 700 nm to 1000 nm, and the light transmittance retention rate thereof after being subjected to 125 ° C. for 1000 hrs is 50% or more for the light having a wavelength of 720 nm.

PRIOR ART DOCUMENT

Patent Document

[Patent Document 1] Japanese Unexamined Patent Application Publication No. 2008-189833
[Patent Document 2] Japanese Unexamined Patent Application Publication No. 2014-33124
[Patent Document 3] Japanese Unexamined Patent Application Publication No. 2005-239901

SUMMARY

As described above, a photocoupler has a light emitting element, such as a light emitting diode, and a light receiving element, such as a phototransistor, and transmits an electrical signal by converting an inputted electrical signal into light with the light emitting element and by returning the light into the electrical signal with the light receiving element.

According to such a signal transmission technology using light, signal transmission paths can be electrically separated from each other. That is, a signal can be transmitted, via light, between a primary electrical circuit and a secondary electrical circuit that are electrically insulated from each other.

It is necessary that a light emitting element on the side of the primary electrical circuit and that on the side of the secondary electrical circuit are insulated from each other by a resin having a light transmission property.

However, according to the study by the present inventors, it has been confirmed in a photocoupler that the light transmission property of a resin is decreased due to discoloration of the resin, and hence there is a need for the improvement thereof.

Other problems and new characteristics will become clear from the description and accompanying drawings of the present specification.

Of the preferred embodiments disclosed in the present application, outlines of the typical ones will be briefly described as follows.

An optical coupling device described in one embodiment disclosed in the present application has a first resin and a second resin between a first element and a second element. The second resin is a cured product of a composition having an epoxy resin and a curing agent, and has a light transmission property. Additionally, the second resin contains an aromatic ring and an alicyclic compound.

A manufacturing method of an optical coupling device described in one embodiment disclosed in the present application includes the steps of: forming a first resin over a first element; and forming a second resin between a second element and the first resin after facing the first resin over the first element and the second element each other. The second resin is a cured product of a composition having an epoxy resin and a curing agent, and has a light transmission property. Additionally, the epoxy resin contains an aromatic ring and an alicyclic compound.

A power conversion system described in one embodiment disclosed in the present application is one including an amplifier circuit part, and an optical coupling part to be coupled to the amplifier circuit part. The optical coupling part has a first resin and a second resin between a first element and a second element. The second resin is a cured product of a composition having an epoxy resin and a curing agent, and has a light transmission property. Additionally, the second resin contains an aromatic ring and an alicyclic compound.

Advantage of the Invention

According to an optical coupling device described in the typical embodiments that are disclosed in the present application and described below, discoloration of a resin in the device can be suppressed and the properties of the device can be improved.

According to a manufacturing method of an optical coupling device, described in the typical embodiments that are disclosed in the present application and described below, an optical coupling device, in which discoloration of a resin in the device is suppressed and good properties are achieved, can be manufactured.

According to a power conversion system described in the typical embodiments that are disclosed in the present application and described below, discoloration of a resin in a device that forms the power conversion system can be suppressed and the properties of the system can be improved.

DETAILED DESCRIPTION

Figure 1:
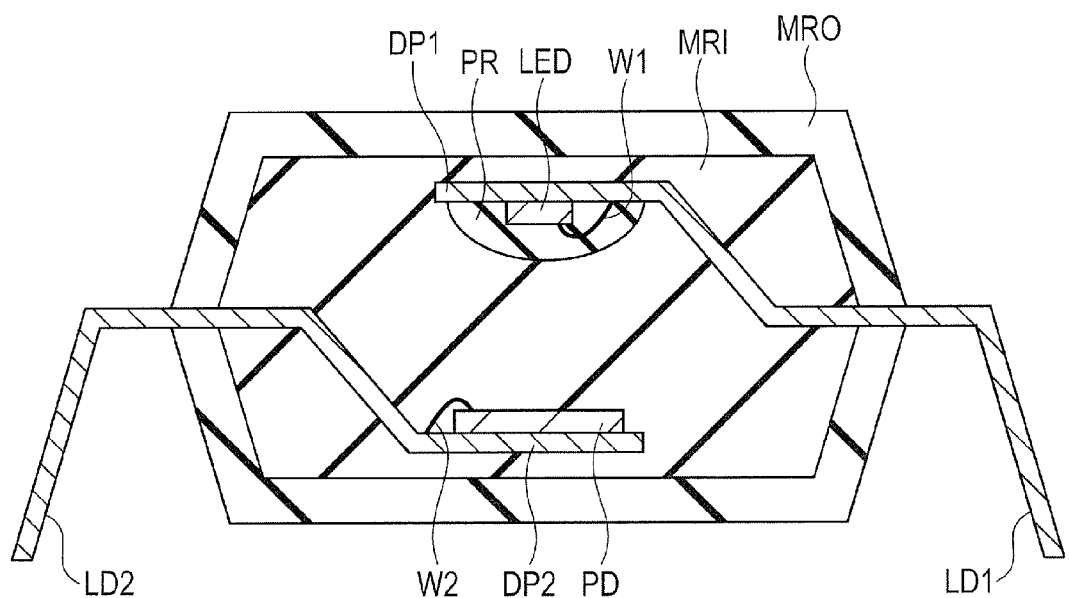
FIG. 1 is a sectional view illustrating a configuration of an optical coupling device according to First Embodiment.

If needed for convenience, the following embodiments will be described by dividing each of them into multiple sections or embodiments; however, the multiple sections or embodiments are not irrelevant to each other, but they are in a relationship in which one is a variation, application example, detailed description, or supplementary description of part or the whole of the others, unless otherwise indicated. When the numbers of elements, etc. (including numbers of pieces, numerical values, amounts, ranges, etc.) are referred to in the following embodiments, the numbers are not limited to the specific ones but may be more or less than the specific numbers, unless otherwise indicated or except when the numbers are obviously limited to the specific numbers in principle.

Further, in the following embodiments, the constituents (also including element steps, etc.) are not necessarily essential, unless otherwise indicated or clearly essential in principle. Similarly, when the shapes and positional relations, etc., of the constituents, etc., are referred to in the following embodiments, those substantially the same or similar to the shapes, etc., should also be included, unless otherwise indicated or except when considered to be clearly otherwise in principle. The same is true with the aforementioned numbers, etc., (including the numbers of pieces, numerical values, amounts, and ranges, etc.).

Hereinafter, preferred embodiments will be described in detail with reference to the accompanying views. In the whole views for explaining the embodiments, members having the same function as each other will be denoted with the same or relevant reference numeral and duplicative description will be omitted. When a plurality of similar members (parts) are present, an individual or specific part may be represented by adding a sign to the collective reference numeral. In the following embodiments, description of the same or similar parts will not be repeated in principle, unless particularly necessary.

In the views used in the embodiments, hatching may be omitted even in sectional views in order to make them easier to see. Alternatively, hatching may be added even in plan views in order to make them easier to see.

In a sectional view or a plan view, the size of each part does not correspond to that of an actual device, and a specific part may be displayed to be relatively large in order to make the view easier to understand. The same is true with the case where a sectional view and a plan view correspond to each other.

(First Embodiment)

Hereinafter, an optical coupling device according to the present embodiment will be described in detail with reference to the accompanying drawings.

[Structure Description]

FIG. 1 is a sectional view illustrating a configuration of an optical coupling device according to the present embodiment. The optical coupling device according to the embodiment is a photocoupler. The optical coupling device according to the embodiment illustrated in FIG. 1 has a light emitting element LED, a light receiving element PD, and two types of resins (PR, MRI) arranged between them. An electrical signal can be transmitted by converting an inputted electrical signal into light with the light emitting element LED and by returning the light to the electrical signal with the light receiving element PD.

The light emitting element (light emitting chip) LED is a photoelectric conversion element that receives an electrical signal to output an optical signal. A light emitting diode using, for example, GaAs, AlGaAs, or the like, can be used as the light emitting element LED. The light emitting element LED is mounted over a chip mounting part DP1. The chip mounting part DP1 is a plate-shaped member including a metal, such as, for example, copper (Cu). The light emitting element LED is fixated (adhered, fixed) over the chip mounting part (die pad) DP1 via a die bond material. The die bond material (mounting material) is a conductive adhesive (conductive paste). Two leads LD1 are arranged around the chip mounting part DP1. One of the two leads LD1 is coupled to the chip mounting part DP1 (see FIG. 3). The surface electrode of the light emitting element LED and the other lead LD1 are electrically coupled together via a wire W1. The wire W1 is a linear member (thin metal wire) including a metal material, such as, for example, gold (Au).

A potting resin PR is formed over the light emitting element LED. In other words, the light emitting element LED over the chip mounting part DP1 is covered with the potting resin PR. It is necessary that the potting resin PR has an insulation property and has a light transmission property for the light having the wavelength of an optical signal. For example, a silicone resin cured product, or the like, can be used as the potting resin PR. In the present embodiment, a mixture of various compounds to be used as materials for resins (PR and later-described MRI) is referred to as a "resin composition", and a cured product of this composition is referred to as a "resin cured product".

A silicone resin cured product is a high molecular compound having, as a main chain, an organopolysiloxane (structure having both an —Si—O—Si—O— chain as a main chain and an organic group over Si).

The silicone resin cured product has a light transmission property for the light having the wavelength of an optical signal. For example, the transmittance per mm of the thickness of the silicone resin cured product is 10% or more for the light having a wavelength within a range of 700 nm to 1000 nm. Further, the reflectance per mm of the thickness of the silicone resin cured product is 90% or less for the light having a wavelength within a range of 700 nm to 1000 nm.

In order to improve the strength of the silicone resin cured product, a filler, such as silica, may be mixed into a silicone resin composition. The content of a filler (e.g., silica) is preferably 20 wt % or less, and more preferably 0 wt %. When being coated, i.e., before being cured, the silicone resin composition has a liquid state. If the content of a filler is more than 20 wt %, the flowability of the silicone resin is decreased. Accordingly, the circumference of the light emitting element LED cannot be uniformly filled with the resin, causing the covering of the light emitting element LED to be decreased. If the content of a filler is more than 20 wt %, the hardness of the silicone resin, after being cured, becomes too large, and it becomes difficult to fully relieve the stress applied to the light emitting element LED.

The light receiving element PD is a photoelectric conversion element that receives an optical signal to output an electrical signal. For example, a photodiode, a phototransistor, a light receiving IC, or the like, can be used as the light receiving element PD. The light receiving element PD is mounted over a chip mounting part (die pad) DP2. The chip mounting part DP2 is a plate-shaped member including a metal, such as, for example, copper (Cu). The light receiving element PD is fixated (adhered, fixed) over the chip mounting part DP2 via a die bond material. The die bond material (mounting material) is a conductive adhesive (conductive paste). A plurality of leads LD2 are arranged around the chip mounting part DP2. One of the leads LD2 is coupled to the chip mounting part DP2. The surface electrodes of the light receiving element PD and the other leads LD2 are electrically coupled together via a wire W2, respectively. The wire W2 is a linear member (thin metal wire) including a metal material, such as, for example, gold (Au).

The light receiving element PD and the light emitting element LED are arranged to face each other. That is, the chip mounting parts DP1 and DP2 are arranged up and down so as to be spaced apart from each other by a certain distance, and the light emitting element LED is arranged below the chip mounting part DP1, and the light receiving element PD above the chip mounting part DP2, as illustrated in FIG. 1. Herein, the light emitting element LED is covered with the potting resin PR. The potting resin PR is a translucent resin.

The space between the potting resin PR and the light receiving element PD and the outer periphery of them are sealed by an internal mold resin (translucent mold resin) MRI. The outer periphery of the internal mold resin MRI is sealed by an external mold resin (light-shielding mold resin) MRO.

An epoxy resin cured product (cured product of an epoxy resin composition) can be used as the internal mold resin MRI. The epoxy resin cured product does not contain a reflecting agent, such as titanium oxide, and has a light transmission property for the light having the wavelength of an optical signal. For example, the transmittance per mm of the thickness of the silicone resin cured product is 10% or more for the light having a wavelength within a range of 700 nm to 1000 nm. Further, the reflectance per mm of the thickness of the silicone resin cured product is 90% or less for the light having a wavelength within a range of 700 nm to 1000 nm.

The epoxy resin cured product is formed by a reaction between the main agent and the curing agent in the epoxy resin composition. The epoxy resin composition can be cured and highly polymerized by crosslinking the epoxy groups in the main agent (epoxy resin) via the curing agent. Each of the main agent and the curing agent may be any of a monomer, from a dimer to a pentamer, an oligomer (below icosamer) and a prepolymer.

A compound, in which the ratio of an aromatic ring is small, is used as the main agent. For example, cycloaliphatic epoxy resins (e.g., dicyclopentadiene-based epoxy resin, etc.), epoxy resins having a nitrogen-containing ring (e.g., triazine ring-based epoxy resin, etc.), and the like, can be used as the main agent in which the ratio of an aromatic ring is small. A compound represented by the following formula (1) can be used as the dicyclopentadiene-based epoxy resin. Alternatively, a compound excluding an aromatic ring may be used as the main agent.

[Chemical Formula 1]

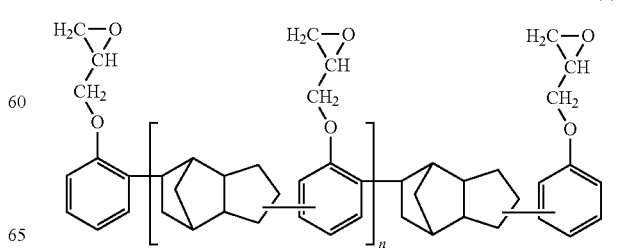

(1)

A compound, in which the ratio of an aromatic ring is small, is used as the curing agent. More preferably, a compound excluding an aromatic ring is used. For example,

[Chemical Formula 3]

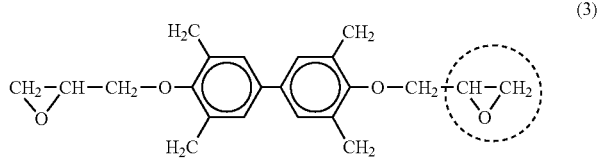

(3)

[Chemical Formula 5]

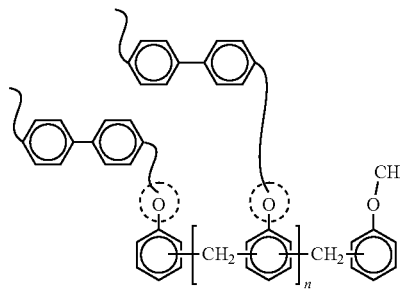

(5)

an acid anhydride curing agent, etc., can be used as the curing agent excluding an aromatic ring. A compound represented by the following formula (2) can be used as the acid anhydride curing agent.

[Chemical Formula 2]

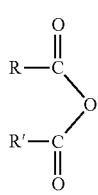

(2)

By thus using a compound, in which the ratio of an aromatic ring is small, as the main agent, the ratio of an aromatic ring in the epoxy resin cured product becomes small, thereby allowing deterioration of the resin to be suppressed.

Further, by using a compound, in which the ratio of an aromatic ring is small, as the curing agent, the ratio of an aromatic ring in the epoxy resin cured product becomes small, thereby allowing deterioration of the resin to be suppressed.

Hereinafter, a reaction between a main agent, in which the ratio of an aromatic ring is large, and a curing agent, in which the ratio of an aromatic ring is large, will be described. With a reaction of a composition having: a compound represented by the following formula (3) as the main agent; and a compound represented by the following formula (4) as the curing agent, a compound represented by the following formula (5), which is an epoxy resin cured product, can be produced. That is, an epoxy group in the compound represented by the formula (3) reacts with an OH group in the compound represented by the formula (4), so that a polymerization reaction progresses (see the portions enclosed by the dashed lines in the formulae (3), (4), and (5)).

[Chemical Formula 4]

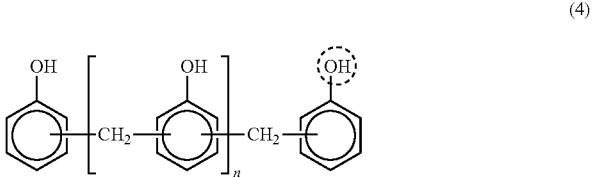

(4)

If such a main agent, in which the ratio of an aromatic ring is large, and such a curing agent, in which the ratio of an aromatic ring is large, are used, the ratio of an aromatic ring in an epoxy resin cured product becomes large.

On the other hand, by using a main agent, in which the ratio of an aromatic ring is small, and a curing agent, in which the ratio of an aromatic ring is small, the ratio of an aromatic ring in an epoxy resin cured product can be made small, thereby allowing deterioration of the resin to be suppressed. Details will be described later.

In an epoxy resin cured product to be used as the internal mold resin MRI, a filler, such as silica, may be mixed into an epoxy resin composition in order to improve the strength of the product. Further, by mixing a filler, such as silica, the difference between the coefficient of thermal expansion of the lead LD1 or LD2 including a metal and that of the internal mold resin MRI can be reduced. A filler, such as silica, is mixed, for example, in a ratio of approximately 60 to 90 wt % based on the weight of the epoxy resin composition (main agent, curing agent).

Additionally, it is preferable not to add a reflecting agent, such as titanium oxide, and a colorant, such as carbon, to an epoxy resin composition to be used as the internal mold resin MRI, in order to secure a light transmission property.

An external mold resin MRO is provided to cover the internal mold resin MRI, so that entry of light from the outside is prevented. Accordingly, the external mold resin MRO has a light-shielding property. For example, a black epoxy resin cured product, etc., can be used as the external mold resin MRO.

In the optical coupling device according to the present embodiment, an electrical signal is supplied to the light emitting element LED via the lead LD1, and the light emitting element LED emits light in response to the electrical signal. The light emitted by the light emitting element LED enters the light receiving element PD via the potting resin (silicone resin cured product) PR and the internal mold resin (epoxy resin cured product) MRI. Then, the light is converted into the electrical signal in the light receiving element PD, which is transmitted, via the lead LD2, to a device (not illustrated) to which the lead LD2 is coupled.

[Description of Manufacturing Method]

FIGS. 2 to 10 are sectional views or plan views each illustrating a manufacturing step of the optical coupling device according to the present embodiment.

Figure 2:
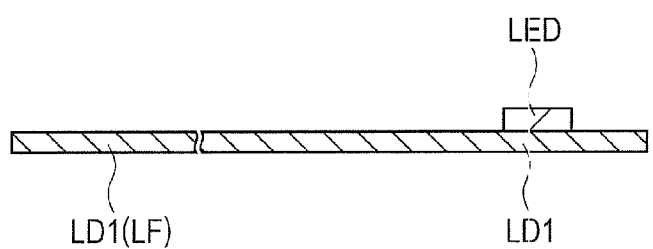
FIG. 2 is a sectional view illustrating a manufacturing step of the optical coupling device according to First Embodiment.
Figure 3:
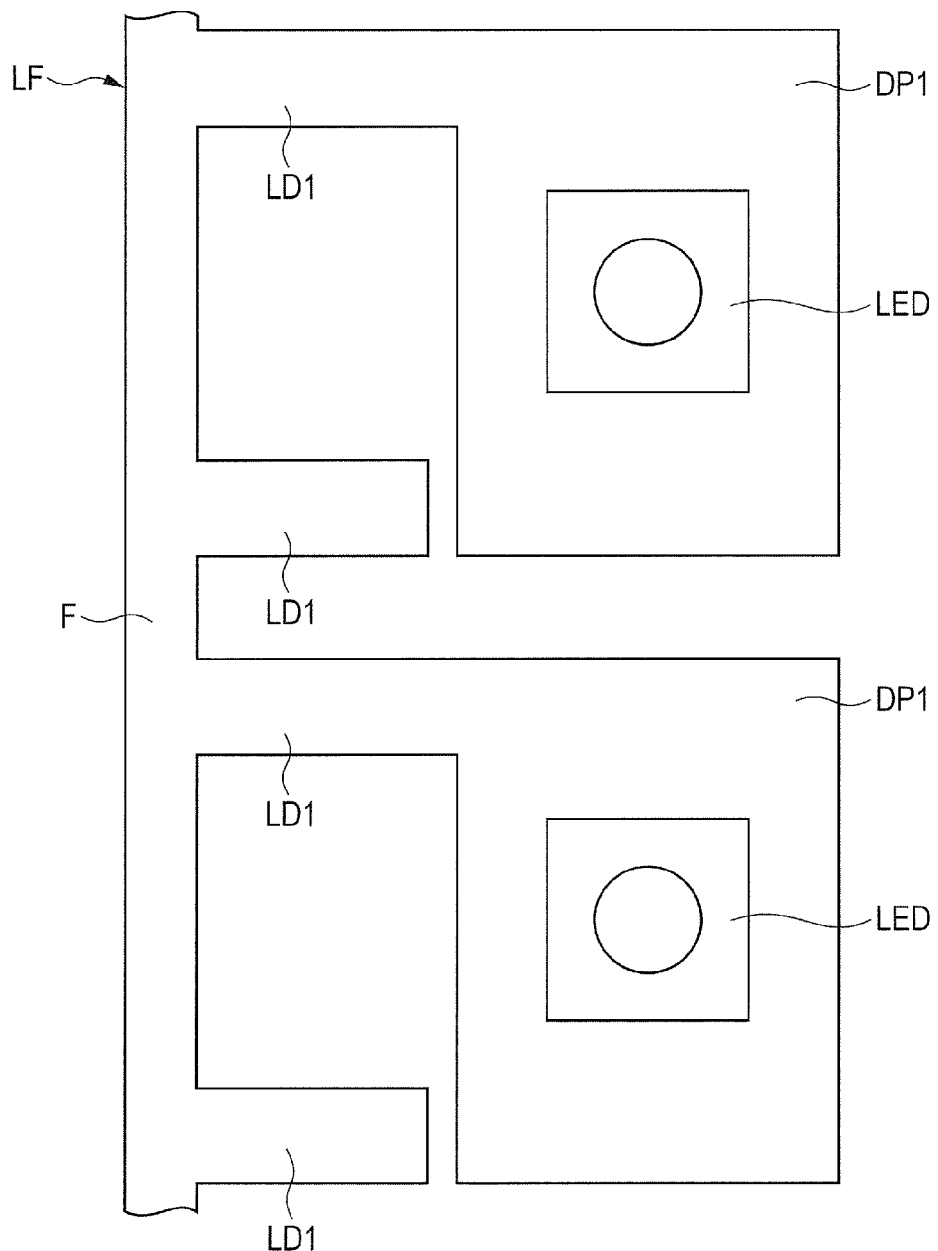
FIG. 3 is a plan view illustrating a manufacturing step of the optical coupling device according to First Embodiment.

As illustrated in FIG. 2, the light emitting element LED is mounted over the chip mounting part DP1 of a lead frame LF. For example, a die bond material (not illustrated) is coated over the chip mounting part DP1 of the lead frame LF, and the light emitting element LED is mounted thereover and fixed. The lead frame LF has a structure in which a plurality of combinations of the chip mounting part DP1 and the leads LD1 arranged at the outer periphery of the part DP1 are interlinked by a frame F. The light emitting element LED is mounted over the chip mounting part DP1 of the lead frame LF. The shape of the lead frame LF is not limited, but for example, the lead frame LF as illustrated in FIG. 3 can be used. As illustrated in FIG. 3, two leads LD1 are arranged around the chip mounting part DP1, and one of them is coupled to the chip mounting part DP1.

Figure 4:
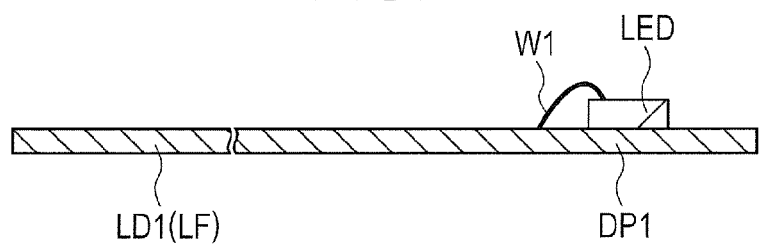
FIG. 4 is a sectional view illustrating a manufacturing step of the optical coupling device according to First Embodiment, the step following that of FIG. 2.
Figure 5:
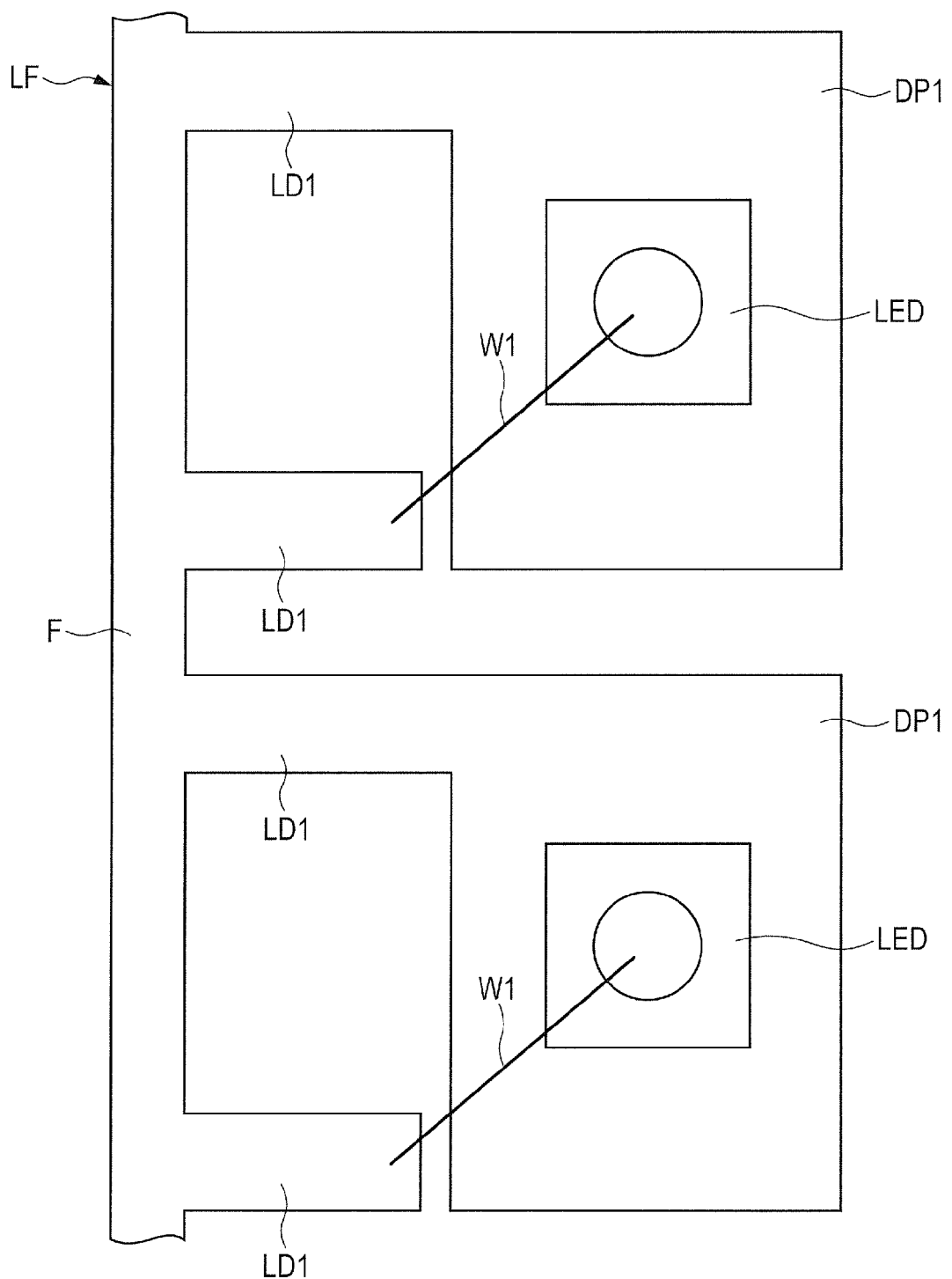
FIG. 5 is a plan view illustrating a manufacturing step of the optical coupling device according to First Embodiment, the step following that of FIG. 3.

Subsequently, the surface electrode of the light emitting element LED and the lead LD1 are coupled together by the wire W1 (wire bonding step), as illustrated in FIGS. 4 and 5. In FIG. 5, the surface electrode of light emitting element LED is indicated by a round shape.

Figure 6:
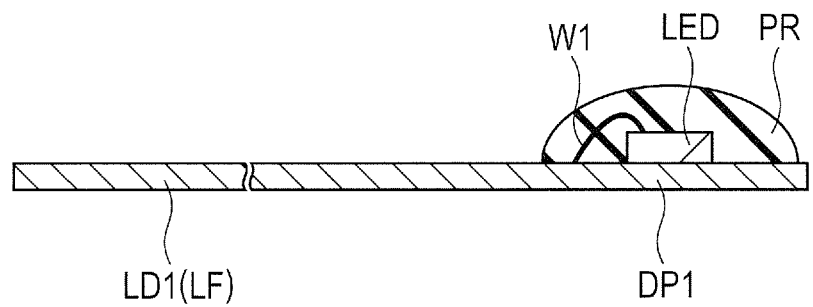
FIG. 6 is a sectional view illustrating a manufacturing step of the optical coupling device according to First Embodiment, the step following that of FIG. 4.

Subsequently, the potting resin PR having a liquid or paste form is dropped (coated) over the light emitting element LED over the chip mounting part DP1, so that the light emitting element LED is covered with the potting resin PR, as illustrated in FIG. 6. For example, a silicone resin cured product, or the like, is used as the potting resin PR. For example, a liquid silicone resin composition is coated and then cured by being subjected to a heat treatment. Heating temperature is, for example, approximately 160° C. to 200° C. Thereafter, the silicone resin cured product is cooled to room temperature (normal temperature).

The light emitting element LED can be protected by thus covering it with the potting resin (silicone resin cured product) PR. In particular, a so-called compound semiconductor, such as GaAs, AlGaAs, or the like, is mostly used for the light emitting element LED. Such a compound semiconductor is harder and more brittle as compared with a semiconductor, such as, for example, silicon. Accordingly, the stress applied to the light emitting element LED using such a material can be relieved by covering the light emitting element LED with a soft silicone resin cured product. A silicone resin cured product has a flexibility higher than that of an epoxy resin cured product. In particular, the light-emitting property of the light emitting element LED may be degraded due to application of stress, but degradation of the light-emitting property can be suppressed by covering the element LED with a soft silicone resin cured product. Further, the distortion, occurring due to the thermal expansion difference with the internal resin, can be suppressed by covering only the vicinity of the light emitting element LED.

Figure 7:
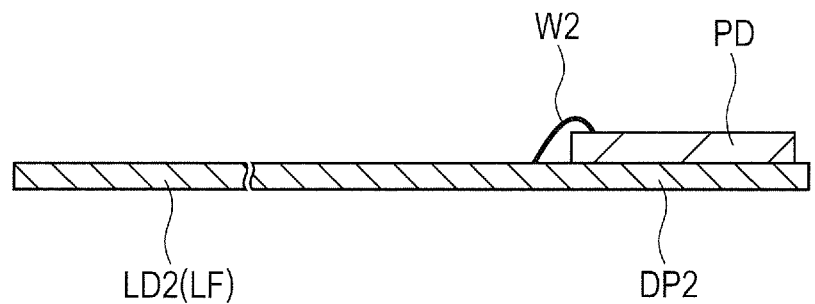
FIG. 7 is a sectional view illustrating a manufacturing step of the optical coupling device according to First Embodiment, the step following that of FIG. 6.

Subsequently, the light receiving element PD is mounted over the chip mounting part DP2. For example, a die bond material (not illustrated) is coated over the chip mounting part DP2 of the lead frame LF, and the light receiving element PD is mounted thereover and fixed, as illustrated in FIG. 7. The lead frame LF for the light receiving element PD has a structure in which a plurality of combinations of the chip mounting part DP2 and the leads LD2 arranged at the outer periphery of the part DP2 are interlinked by a frame F.

Subsequently, a plurality of the surface electrodes of the light receiving element PD and the leads LD2 are coupled together by the wire W2, respectively (wire bonding step).

Herein, after the light emitting element LED is mounted over the chip mounting part DP1, the light receiving element PD is mounted over the chip mounting part DP2, but the order of these steps is not limited. Additionally, the potting resin PR is not formed over the light receiving element PD in FIG. 7, but the potting resin PR may be formed thereover. However, when a semiconductor, such as, for example, silicon, is used as the light receiving element PD, it is not likely to undergo stress deformation. Accordingly, the potting resin (silicone resin cured product) PR can be omitted.

Figure 8:
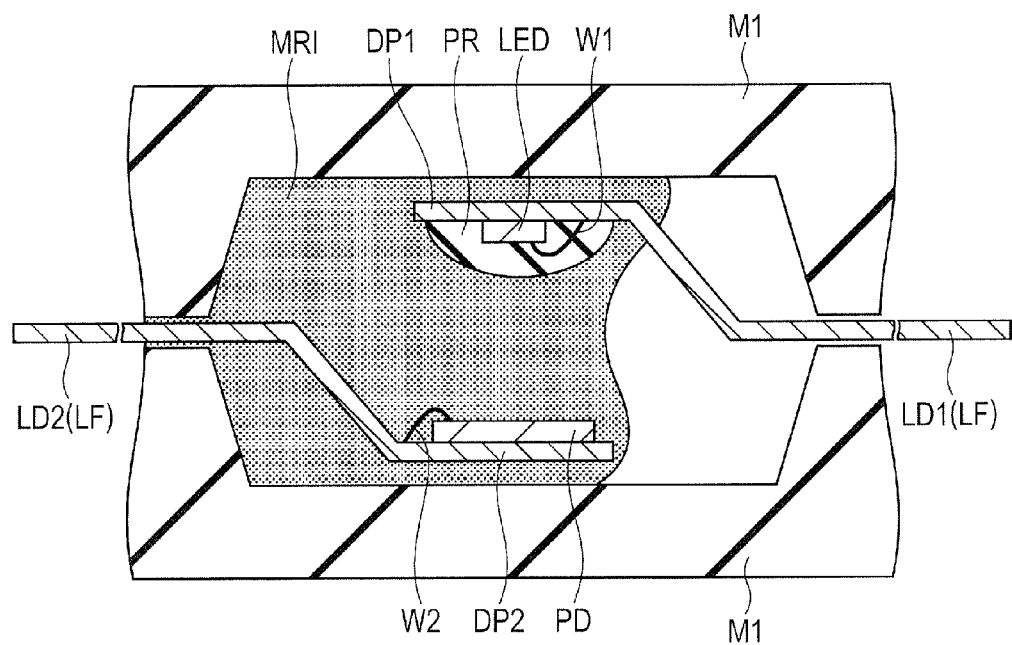
FIG. 8 is a sectional view illustrating a manufacturing step of the optical coupling device according to First Embodiment, the step following that of FIG. 7.

Subsequently, the lead frame LF over which the light emitting element LED is mounted and the lead frame LF over which the light receiving element PD is mounted are faced with each other, so that both the lead frames LF are sandwiched by a forming mold M1, as illustrated in FIG. 8. Herein, the leads LD1 and LD2 of the two lead frames LF may be processed into a desired shape by press working, etc., if necessary.

An epoxy resin composition is injected (put) into the space (cavity) between the forming mold M1 in the state where the two lead frames LF are being sandwiched by the forming mold M1, and the resin composition is subjected to a heat treatment so as to form the internal mold resin MRI. A sealing method, in which a sealing resin is supplied to a space formed in the forming mold M1 and then cured as stated above, is referred to as a transfer mold method.

Herein, an epoxy resin cured product is used as the internal mold resin MRI in the present embodiment. In particular, an epoxy resin cured product is used, the cured product being formed by the reaction (thermal curing, polymerization, crosslinking, high polymerization) between the aforementioned main agent and curing agent in each of which the ratio of an aromatic ring is small. Also in the present embodiment, polymerization progresses with an epoxy group in the main agent reacting with the curing agent. This reaction progresses by heating. By thus making the ratio of an aromatic ring in the epoxy resin cured product small, deterioration of the resin can be suppressed as described later. Thereby, degradation of the light transmission property of the epoxy resin cured product can be suppressed, and degradation of the transmission performance for an optical signal can be reduced. Heating temperature is, for example, approximately 160° C. to 200° C. Thereafter, the aforementioned epoxy resin is cooled to room temperature.

In this step, the light emitting element LED and the light receiving element PD are integrated with each other by the internal mold resin MRI. Specifically, the internal mold resin MRI is formed between the potting resin PR and the light receiving element PD. Also, the internal mold resin MRI is formed to surround the potting resin PR, the light receiving element PD, and the region between them. The potting resin PR and the internal mold resin MRI are arranged between the light emitting element LED and the light receiving element PD, but these resins have a light transmission property, as described above, and hence there is no obstacle to the transmission of an optical signal. For example, the transmittance per mm of the thickness of each of the potting resin PR and the internal mold resin MRI is 10% or more for the light having a wavelength within a range of 700 nm to 1000 nm. Further, the reflectance per mm of the thickness thereof is 90% or less for the light having a wavelength within a range of 700 nm to 1000 nm.

A withstand voltage can be improved by adopting such a double mold structure (sealing body structure by the potting resin PR and the internal mold resin MRI). The withstand voltage of the optical coupling device according to the present embodiment, the device adopting the double mold structure, is, for example, 10 kV or more.

Further, an epoxy resin composition, in which the ratio of an aromatic ring is small, is used as described above, and hence deterioration of the resin can be suppressed. Even when the device is used particularly under a hot environment, as the case of an in-car optical coupling device, deterioration of the resin can be suppressed, and a decrease in the light transmission property can be suppressed.

Thereby, the life of the device can be extended. Specifically, in a high temperature-long term storage test, the properties can be maintained at 150° C. for 10000 hours or longer, as described later.

Figure 9:
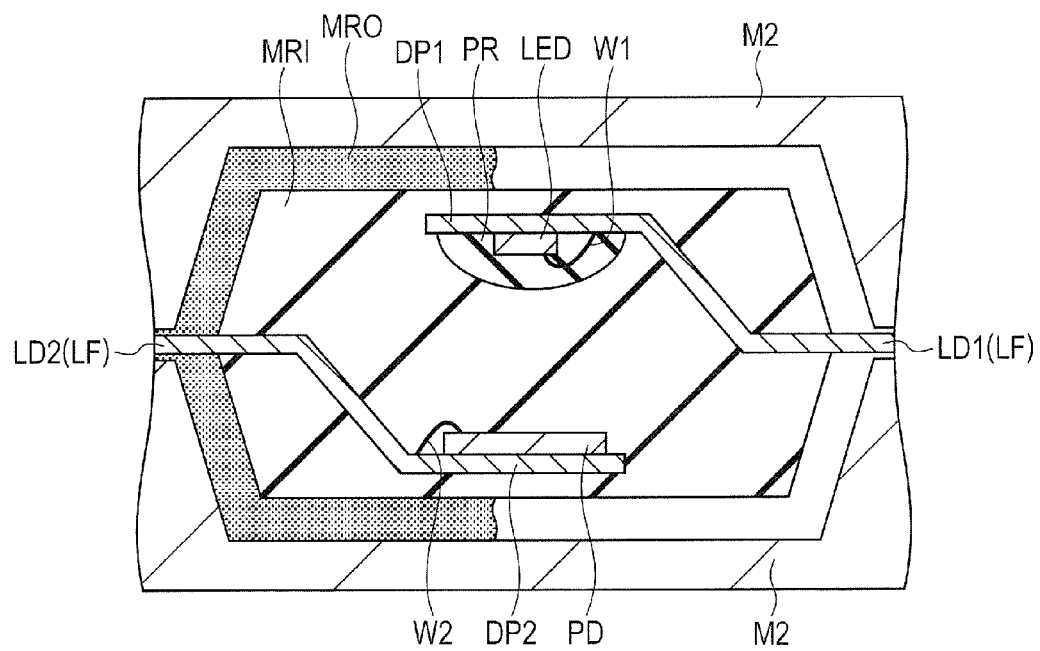
FIG. 9 is a sectional view illustrating a manufacturing step of the optical coupling device according to First Embodiment, the step following that of FIG. 8.

Subsequently, the lead frames LF protruding from the internal mold resin MRI are sandwiched by the forming mold M2, as illustrated in FIG. 9. In this state, the epoxy resin composition is injected into the space (cavity) between the forming mold M2 and to the outer periphery of the internal mold resin MR, and then subjected to a heat treatment. Thereby, the external mold resin MRO covering the internal mold resin MRI is formed. For example, a black epoxy resin cured product, or the like, can be used as the external mold resin MRO. In the external mold resin MRO, the ratio of an aromatic ring may be larger than that of the internal mold resin MRI. A cured product of a composition in which, for example, the compound represented by the above formula (3) is used as a main agent and the compound represented by the above formula (4) is used as a curing agent and a colorant, such as carbon, is added to them, can be used as the external mold resin MRO. For example, the aforementioned composition is injected into the space (cavity) between the forming mold M2, and then subjected to a heat treatment. Heating temperature is, for example, approximately 160° C. to 200° C. Thereafter, the aforementioned epoxy resin cured product is cooled to room temperature.

Figure 10:
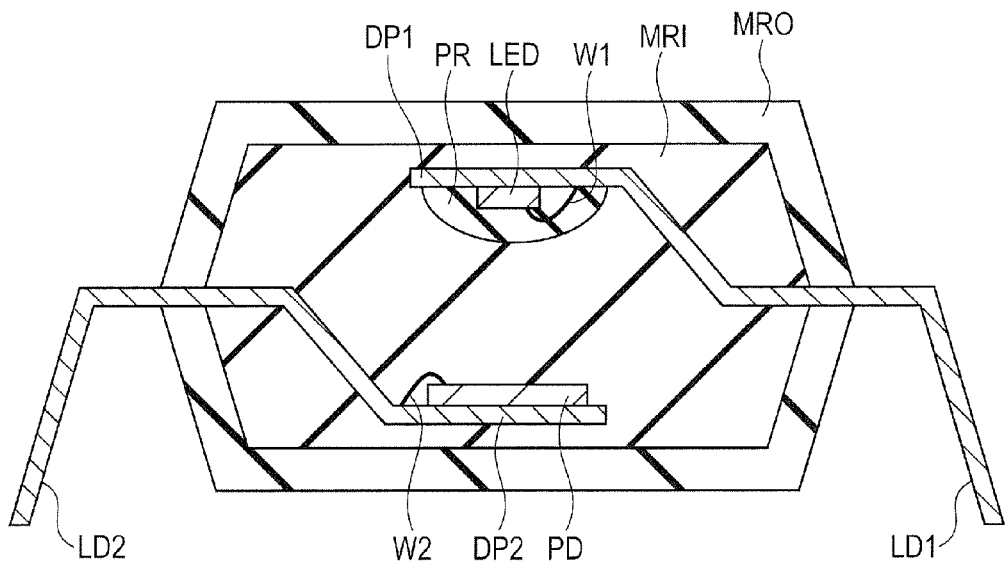
FIG. 10 is a sectional view illustrating a manufacturing step of the optical coupling device according to First Embodiment, the step following that of FIG. 9.

Subsequently, the leads LD1 and LD2 are cut off from the lead frames LF, and the leads (outer lead parts) LD1 and LD2 each protruding from the external mold resin MRO are bent, as illustrated in FIG. 10. Herein, the leads LD1 and LD2 may be bent simultaneously with the cutting thereof.

The optical coupling device according to the present embodiment can be formed by the aforementioned steps.

As described above, an epoxy resin cured product, in which the ratio of an aromatic ring is small, is used as the internal mold resin MRI in the present embodiment, and hence deterioration of the internal mold resin MRI can be suppressed.

Figure 11:
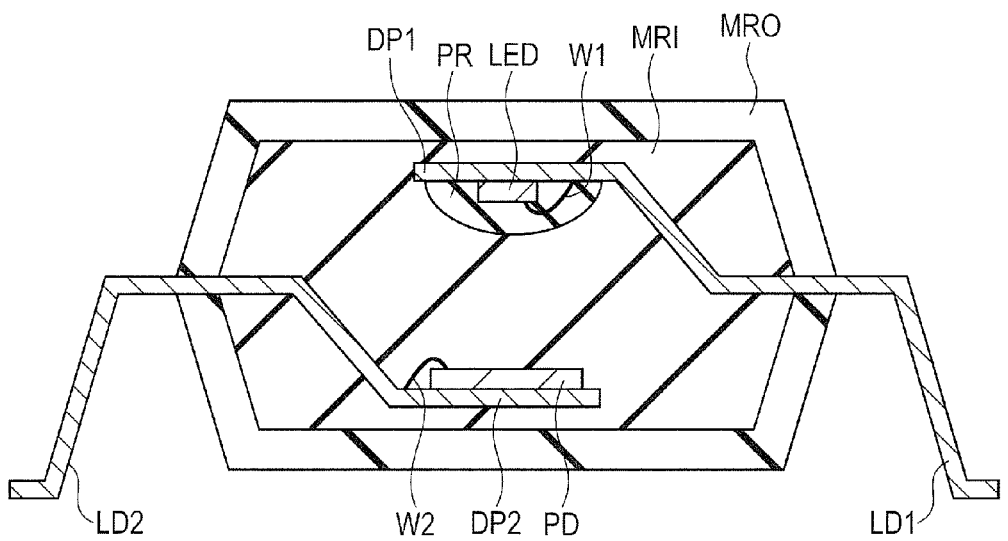
FIG. 11 is a sectional view illustrating a configuration of an optical coupling device of First Comparative Example.

FIG. 11 is a sectional view illustrating a configuration of an optical coupling device of First Comparative Example. In the optical coupling device in FIG. 11, for example, an epoxy resin composition, in which the ratio of an aromatic ring is large, is used as the internal mold resin MRI.

Examples of the epoxy resin cured product in which the ratio of an aromatic ring is large include: a cured product using an epoxy resin containing a benzene ring in a main agent (e.g., o-cresol novolac-based epoxy resin, etc.); a cured product using a phenol-based curing agent as a curing agent; a cured product of the compound represented by the aforementioned formula (5); and the like. If such an epoxy resin cured product is used, a void is produced between the potting resin PR and the internal mold resin MRI.

Figure 12A:
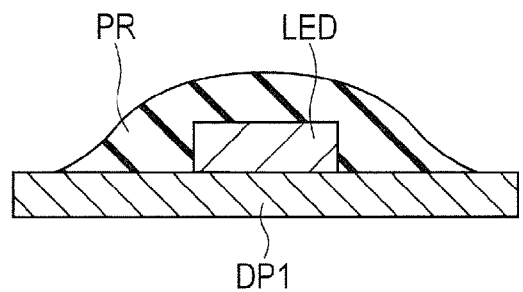
FIGS. 12(A) to 12(C) are schematic views illustrating a mechanism by which a void is produced in a resin interface.
Figure 12B:
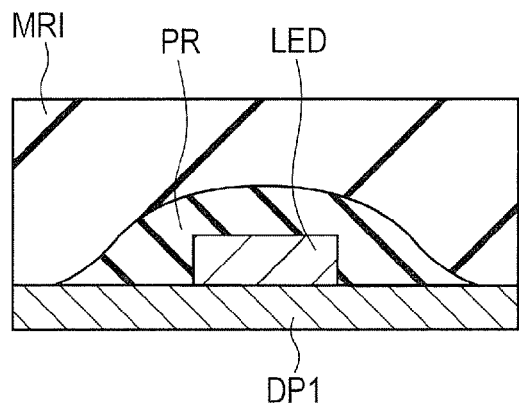
Figure 12C:
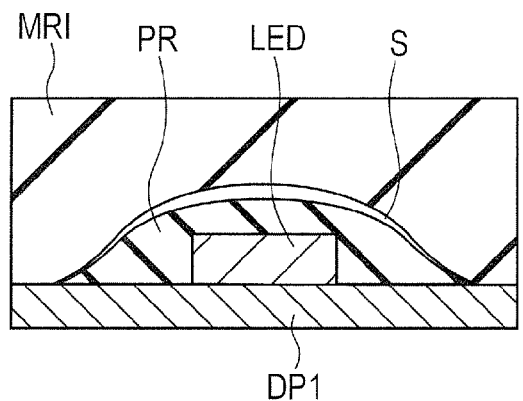

Occurrence of such a void will be described with reference to FIG. 12. FIGS. 12(A) to 12(C) are schematic views illustrating a mechanism by which a void is produced in a resin interface. There is no chemical bond in the surface of the potting resin (silicone resin cured product) PR covering the light emitting element LED illustrated in FIG. 12(A), and hence the potting resin (silicone resin cured product) PR and the internal mold resin (epoxy resin cured product) MRI are not chemically bonded. Additionally, these resins are materials different from each other, and hence the coefficients of thermal expansion thereof are different from each other. For example, the coefficients of thermal expansion of a silicone resin (400 ppm) and an epoxy resin (22 ppm) are different from each other by one order or more. Accordingly, when the internal mold resin (epoxy resin cured product) MRI is heated and then cooled to room temperature during the formation thereof, the interface between the potting resin (silicone resin cured product) PR and the internal mold resin (epoxy resin cured product) MRI is exfoliated as illustrated in FIG. 12(B), thereby causing a void S (FIG. 12(C)).

Figure 13A:
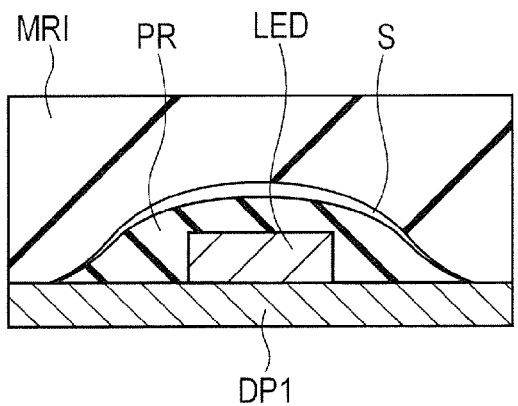
FIGS. 13(A) to 13(C) are schematic views illustrating a mechanism by which a resin is discolored.
Figure 13B:
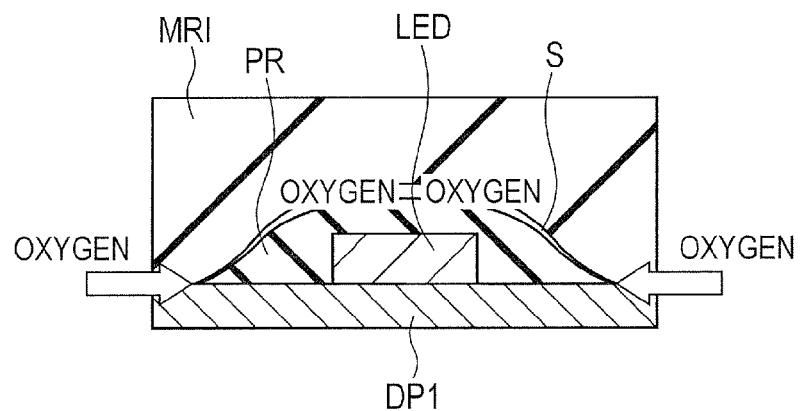
Figure 13C:
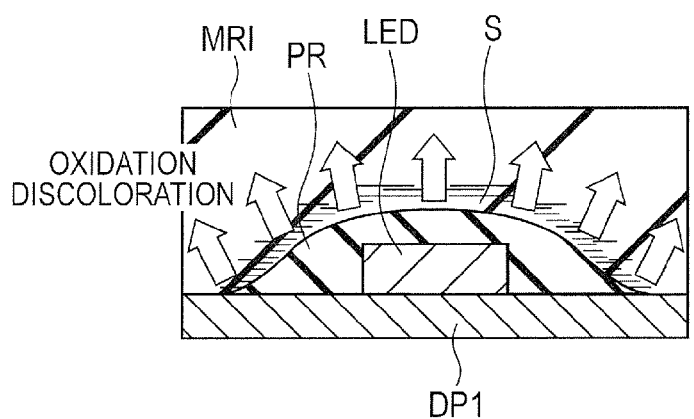
Figure 14:
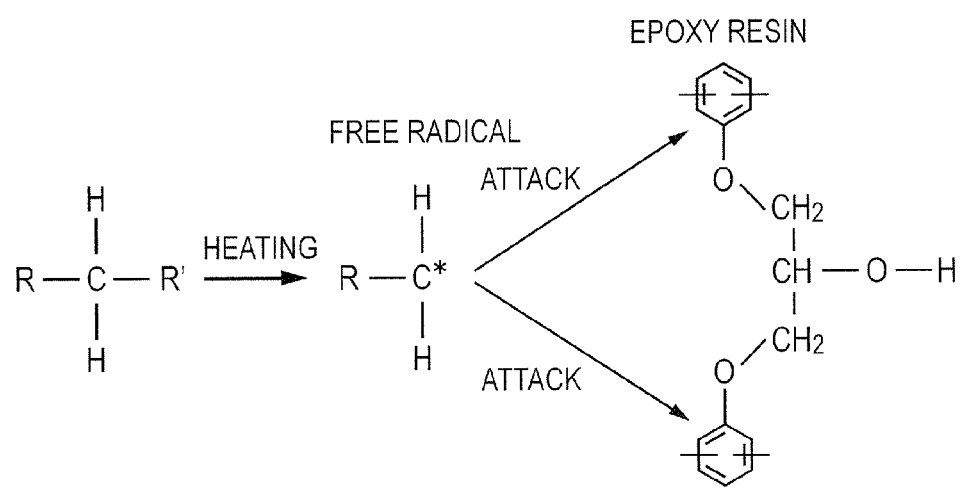
FIG. 14 is a view schematically illustrating a reaction in which an aromatic ring undergoes oxidation discoloration.

Further, if the void S is produced between the resins, the internal mold resin (epoxy resin cured product) MRI is discolored due to an influence by the air (oxygen) in the void S. This discoloration will be described with reference to FIGS. 13 (A) to 14. FIGS. 13(A) to 13(C) are schematic views illustrating a mechanism by which the resin is discolored. FIG. 14 is a view schematically illustrating a reaction in which an aromatic ring undergoes oxidation discoloration. When the void S is produced in the interface between the potting resin (silicone resin cured product) PR and the internal mold resin (epoxy resin cured product) MRI, as illustrated in 13(A), air (oxygen) enters the inside of the void (FIG. 13(B)). The epoxy resin undergoes oxidation discoloration due to this oxygen. In particular, an aromatic ring has high reactivity and a carbon compound radical (free radical) produced by oxidation combines with an aromatic ring (benzene ring), so that a C=C bond, C—C bond, C—R bond, and the like, are cut (FIG. 14). A benzene ring has a high electron density due to $\pi$ electrons, and hence it is likely to be attacked by a free radical. With this reaction, a new carbon compound radical (free radical) is produced such that the reaction, in which the epoxy resin cured product undergoes oxidation discoloration, progresses in a chain reaction (FIG. 13(C)). The oxidation discoloration reaction is likely to progress particularly in a hot environment.

With such oxidation discoloration of the epoxy resin cured product, the light transmission property of the epoxy resin cured product is decreased, and the transmission performance for an optical signal is degraded.

Figure 15:
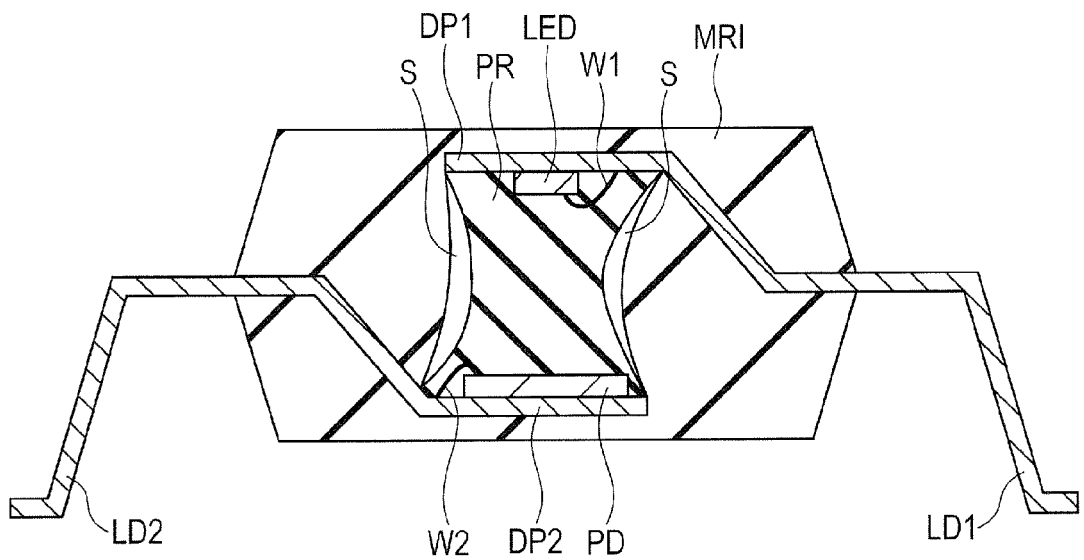
FIG. 15 is a sectional view illustrating a configuration of an optical coupling device of Second Comparative Example.

FIG. 15 is a sectional view illustrating a configuration of an optical coupling device of Second Comparative Example. As the optical coupling device of the Second Comparative Example illustrated in FIG. 15, when the potting resin (silicone resin cured product) PR is arranged, for example, between the light emitting element LED and the light receiving element PD, the interfaces between the potting resin (silicone resin cured product) PR and the internal mold resin (epoxy resin cured product) MRI are produced on both the sides of the light emitting element LED, and hence the epoxy resin cured product is little influenced by an oxidation discoloration reaction. In other words, discoloration of the epoxy resin cured product, the discoloration intersecting the transmission path of an optical signal between the light emitting element LED and the light receiving element PD, is never generated. However, in the structure of the Second Comparative Example in which the potting resin (silicone resin cured product) PR is arranged between the light emitting element LED and the light receiving element PD, a spark is generated between the light emission side and the light receiving side via the void S, thereby decreasing the withstand voltage.

On the other hand, by adopting a double molding structure (sealing body structure by the potting resin PR and the internal mold resin MRI), as in the present embodiment, the withstand voltage can be improved. Further, when an epoxy resin cured product, in which the ratio of an aromatic ring is small, is used, the progress of the aforementioned oxidation discoloration reaction can be suppressed. Thereby, degradation of the transmission performance for an optical signal can be suppressed. Furthermore, degradation of the transmission performance for an optical signal can be suppressed even under a hot environment, thereby allowing the life at high temperature to be extended. For example, in a high temperature-long term storage test, the properties can be maintained at 150° C. for 10000 hours or longer.

Figure 16A:
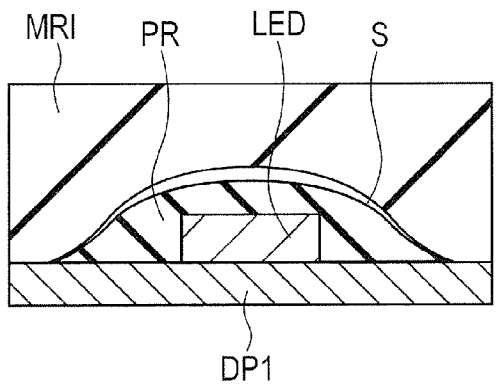
FIGS. 16(A) to 16(C) are schematic views illustrating a mechanism by which discoloration of a resin is suppressed.
Figure 16B:
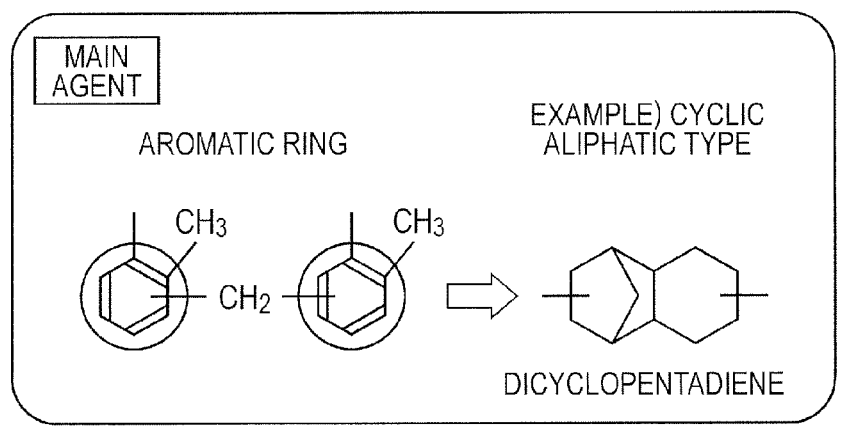
Figure 16C:
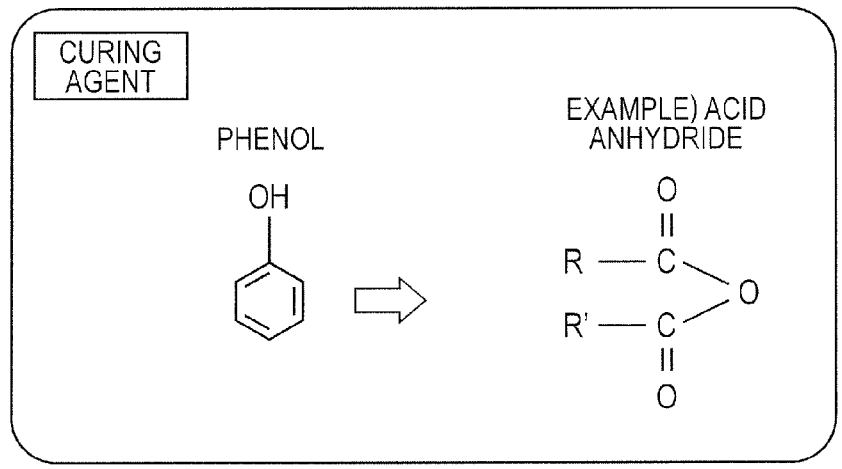

FIGS. 16(A) to 16(C) are schematic views illustrating a mechanism by which discoloration of the resin is suppressed. Even if the void S is produced as illustrated in FIG. 16 (A), the reaction, in which an epoxy resin cured product undergoes oxidation discoloration, is not likely to progress by using the epoxy resin cured product in which the ratio of an aromatic ring is small, thereby allowing the oxidation discoloration of the epoxy resin cured product to be suppressed.

In order to make the ratio of an aromatic ring in an epoxy resin cured product small, an aromatic ring in a main agent is replaced by a cycloaliphatic compound, as illustrated in FIG. 16(B). For example, a benzene ring is replaced by dicyclopentadiene. Additionally, in order to make the ratio of an aromatic ring in an epoxy resin cured product small, a curing agent is changed from a compound having an aromatic ring to a compound excluding it, as illustrated in FIG. 16(C). For example, phenol is changed to an acid anhydride.

EXAMPLE

The results of oxidation discoloration tests for epoxy resin cured products in which the ratio of an aromatic ring is small are shown in Table 1. Three types of an epoxy resin composition A, an epoxy resin composition B, and an epoxy resin composition C were used as the epoxy resin compositions. Each of the epoxy resin compositions has a main agent, in which the ratio of an aromatic ring is lowered, and a curing agent, in which the ratio thereof is lowered. An epoxy resin composition in which the ratio of an aromatic ring is large, specifically, an epoxy resin composition, having a main agent containing o-cresol novolac and a curing agent containing phenol, was also tested in the same way, as a comparative example (Ref).

Each of the epoxy resin compositions was cured, and a sample thereof, having a thickness of 1 mm, was left in a thermostatic oven (in the air) at 150° C. for 500 hours. In this test, the surface of the epoxy resin cured product is exposed to the air, and hence the test is a more accelerated test than a test performed in a manufactured product state. In a manufactured product state, the internal mold resin (epoxy resin cured product) MRI is covered with the external mold resin MRO and the paths through which air (oxygen) is supplied are few, and hence the progress of discoloration is slower than the values shown in Table 1. For example, the degree of the discoloration of the epoxy resin cured product after 150° C. for 10000 hours in a manufactured product state can be matched with the color of the epoxy resin cured product in the sample after 150° C. for 500 hours in the present test.

TABLE 1

|   | initial state | 24 H | 48 H | 168 H | 300 H | 500 H |
|---|---|---|---|---|---|---|
| Rev. | white | light cream | cream | orange | drown | dark brown |
| A | white | white | white | white | white | white |
| B | white | white | white | white | white | white |
| C | white | white | white | white | white | white |

In the case of Comparative Example (Ref), the discoloration of the sample that was white in the initial state progresses with elapsed time of 24 hours, 48 hours, 168 hours, 300 hours, and 500 hours, and the sample becomes dark brown after 500 hours, as illustrated in Table 1.

On the other hand, with respect to the epoxy resin compositions in which the ratio of an aromatic ring is lowered, the discoloration of the sample (epoxy resin cured product) using any of the compositions A to C is not confirmed after 500 hours. It has been revealed that the properties can be maintained at 150° C. for 10000 hours or longer in a manufactured product state by using an epoxy resin cured product in which the ratio of an aromatic ring is lowered.

CONCLUSION

Thus, by using, as a main agent (epoxy resin), a compound in which the ratio of an aromatic ring is small, the ratio of an aromatic ring in the epoxy resin cured product becomes small, and hence deterioration of the resin can be suppressed.

An example of the epoxy resin in which the ratio of an aromatic ring is small includes one containing an aromatic ring and an alicyclic compound. An epoxy resin cured product formed by curing the epoxy resin contains the aromatic ring and the alicyclic compound. The ratio of an alicyclic compound in the epoxy resin or the cured product is preferably 20% or more. The ratio of an alicyclic compound is calculated by (the number of alicyclic compounds/the total of the number of aromatic rings and the number of alicyclic compounds in an epoxy resin or a cured product)× 100%. Alternatively, an epoxy resin or a cured product excluding an aromatic ring may be used.

The aforementioned o-cresol novolac-type epoxy resin (main agent) is represented by the following formula (6):

[Chemical Formula 6]

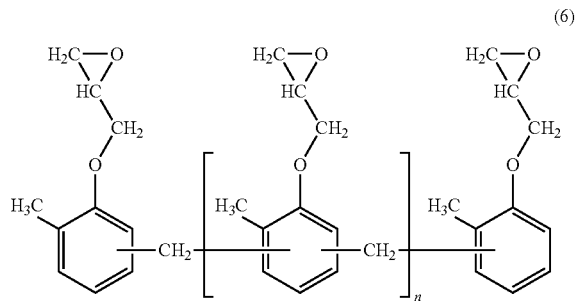

(6)

In order to reduce the ratio of an aromatic ring, the compound represented by the aforementioned formula (1) (dicyclopentadiene-type epoxy resin (main agent)) is used in place of the compound represented by the formula (6). That is, the portion of a benzene ring is replaced by dicyclopentadiene (see FIG. 16(B)).

In this case, the ratio of an aromatic ring to an alicyclic compound is 1:1 in the repeating unit structure (structure in the parenthesis) in the main agent. For example, when an aromatic ring is indicated by A and an alicyclic compound by B, the structure is represented by -(A-B)n-. In this case, the ratio of an alicyclic compound becomes approximately 50%.

Alternatively, an epoxy resin using a nitrogen-containing ring (e.g., triazine ring) may be used in place of an aromatic ring. Also in this case, the ratio of an aromatic ring becomes small. An example of an epoxy resin in which the ratio of an aromatic ring is small includes one containing an aromatic ring and a nitrogen-containing ring. An epoxy resin cured product formed by curing the epoxy resin also contains the aromatic ring and the nitrogen-containing ring. The ratio of a nitrogen-containing ring in the epoxy resin or the cured product is preferably 20% or more. Alternatively, an epoxy resin or a cured product excluding an aromatic ring may be used.

Also, a compound excluding an aromatic ring (e.g., acid anhydride), or the like, is used as the curing agent.

An epoxy resin cured product is used as the internal mold resin MRI in the present embodiment, but a silicone resin cured product may be used as that. A silicone resin cured product excludes a reflecting agent, such as titanium oxide, and has a light transmission property for the light having the wavelength of an optical signal. For example, the transmittance per mm of the thickness of the silicone resin cured product is 10% or more for the light having a wavelength within a range of 700 nm to 1000 nm. Further, the reflectance per mm of the thickness of the silicone resin cured product is 90% or less for the light having a wavelength within a range of 700 nm to 1000 nm. The binding energy between atoms of a silicone resin cured product is larger than that of an epoxy resin cured product, and hence a silicone resin cured product is less likely to be decomposed than an epoxy resin cured product. Further, if a silicone resin cured product is decomposed (oxidized), it becomes a compound having a high light transmission property, such as $SiO_2$, and hence discoloration is not likely to be generated. Accordingly, degradation of the transmission performance for an optical signal can be reduced.

(Second Embodiment)

In the present embodiment, examples of the applications of the optical coupling device according to First Embodiment will be described.

A silicone resin cured product is used as the potting resin PR in First Embodiment; however, of silicone resin cured products, a rubber-like silicone resin cured product having a Shore A hardness of 15 to 30 may be used as the potting resin PR.

By using such a silicone resin cured product, the transmission property for an optical signal can be further stabilized, in addition to the advantages of First Embodiment (improvement in a withstand voltage, extended life at high temperature).

It can also be considered that, for example, a gel-like, soft silicone resin cured product having a low hardness (a Shore A hardness of less than 20) is used. By using such a gel-like, soft silicone resin cured product having a low hardness, the potting resin (silicone resin cured product) PR can be deformed to follow the concavities and convexities of the surface of the internal mold resin (epoxy resin cured product) MRI. In such a case, a void between the resins, which has been described in First Embodiment, can be filled (resins can be closely adhered together), and hence entry of oxygen can be reduced, and discoloration of the internal mold resin (epoxy resin cured product) MRI can be reduced.

Figure 17A:
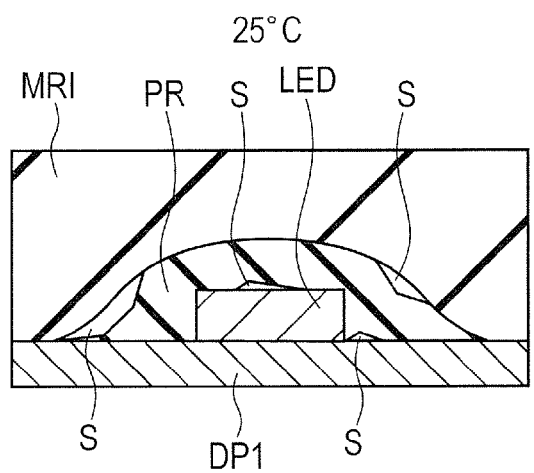
FIGS. 17(A) to 17(C) are schematic views illustrating states of voids, when a silicone resin cured product having a low hardness is used.
Figure 17B:
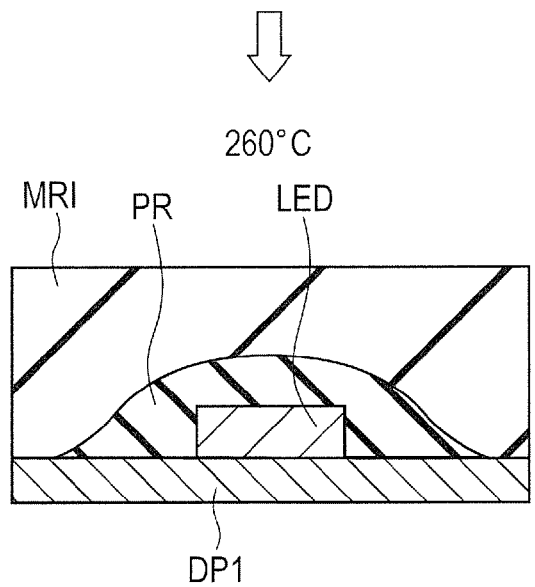
Figure 17C:
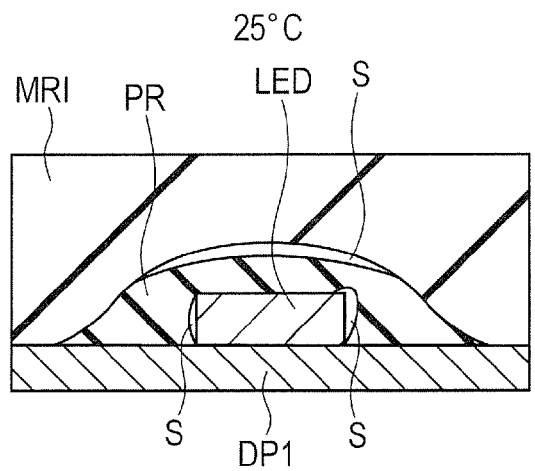

However, a gel-like, soft silicone resin cured product having a low hardness has a tackiness, and hence the position of the joint surface between resins is likely to change due to a change in temperature (vertical change in temperature, reflow, temperature cycle, etc.). For example, when a temperature is changed (e.g., normal temperature (25° C.)→reflow temperature (260° C.)→cooling (25° C.)), the position and size of the void S, located in the transmission path of an optical signal, are changed as illustrated in FIGS. 17(A) to 17(C). In this case, the transmission property for an optical signal is changed. A cohesive failure may also be caused. FIGS. 17(A) to 17(C) are schematic views illustrating the states of voids, when a silicone resin cured product having a low hardness is used.

Figure 18A:
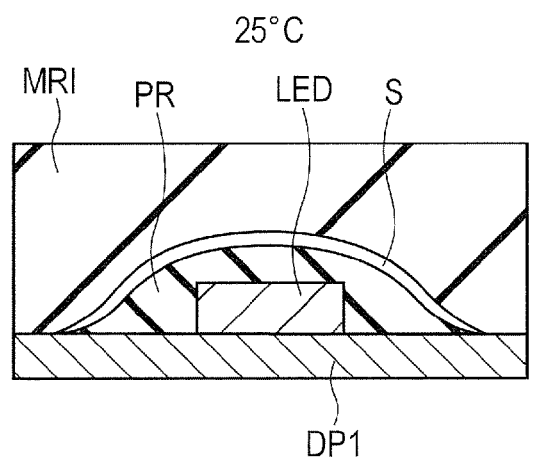
FIGS. 18(A) to 18(C) are schematic views illustrating states of a void, when a silicone resin cured product according to Second Embodiment is used.
Figure 18B:
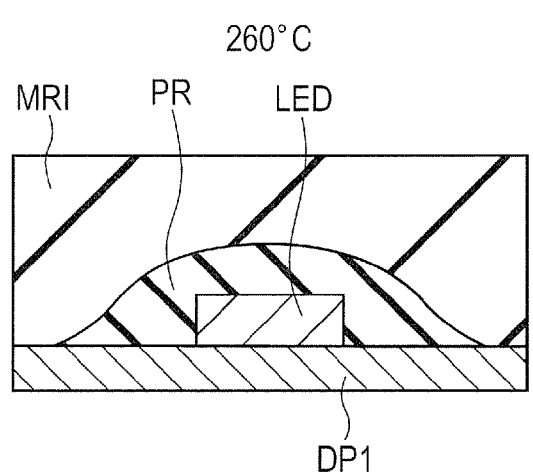
Figure 18C:
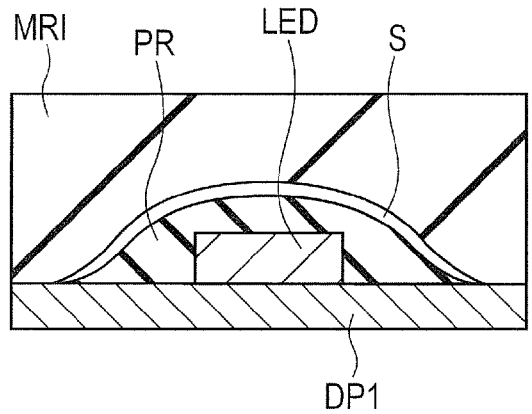

On the other hand, when a rubber-like silicone resin cured product having a certain hardness, for example, a Shore A hardness of 15 to 30 is used, the void S may be caused and an influence by oxygen may be caused, but changes in the position and size of the void S becomes less than when a silicone resin cured product having a low hardness is used, as illustrated in FIGS. 18(A) to 18(C). Herein, with respect to an influence by oxygen, the problem of discoloration of the resin can be avoided by lowering the ratio of an aromatic ring in the epoxy resin cured product described in First Embodiment. FIGS. 18(A) to 18(C) are schematic views illustrating the states of a void, when the silicone resin cured product according to the present embodiment is used.

Thus, with a combination of a rubber-like silicone resin cured product having, for example, a Shore A hardness of 15 to 30 and an epoxy resin cured product in which the ratio of an aromatic ring is small, the transmission property for an optical signal can be stabilized, in addition to the advantages of First Embodiment.

(Third Embodiment)

In the present embodiment, application examples of the optical coupling device described in First Embodiment or Second Embodiment will be described. The places, to which the optical coupling device described in First Embodiment or Second Embodiment can be applied, are not limited, and for example, the device can be used in the power conversion system described below.

Figure 19:
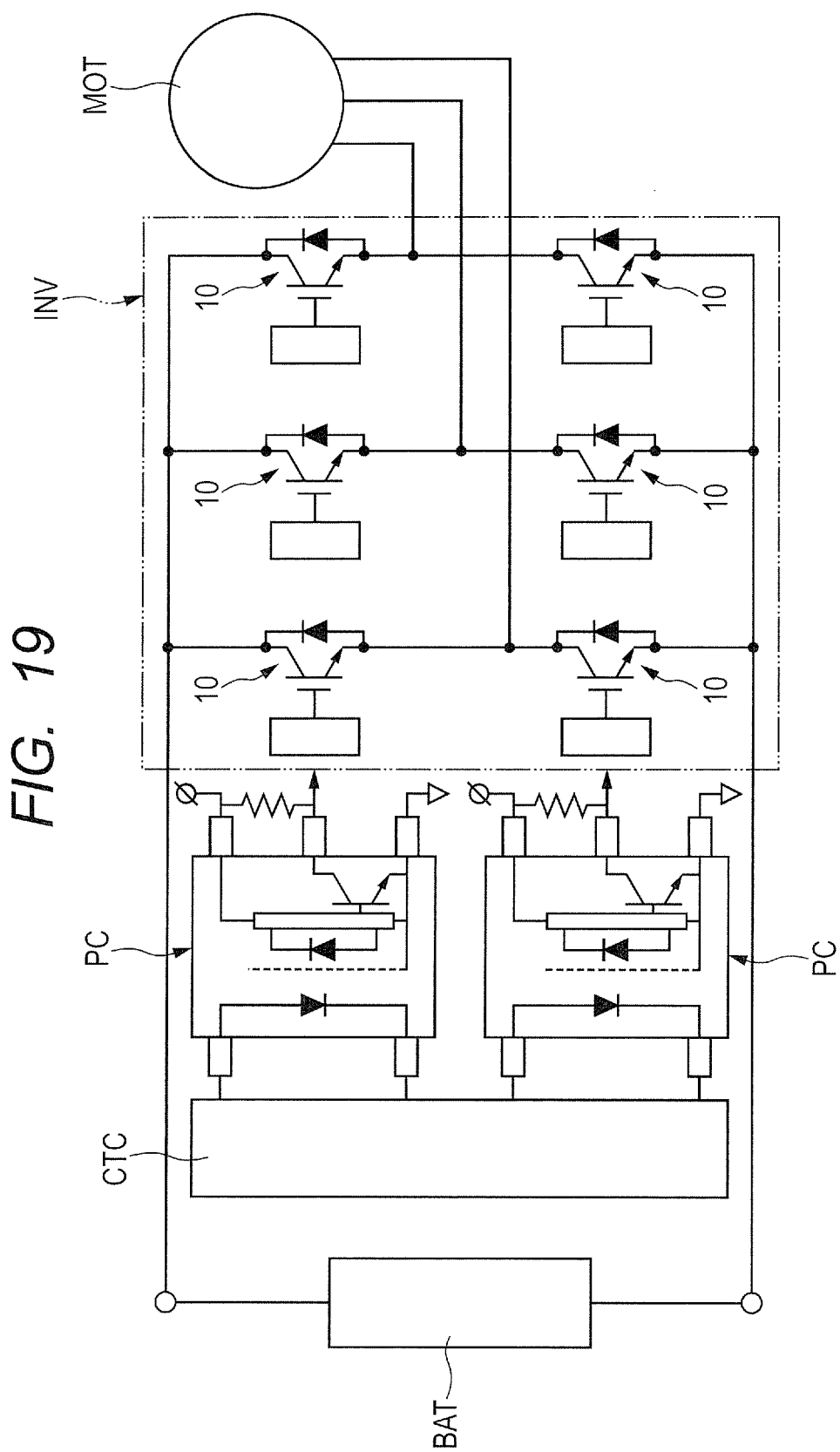
FIG. 19 is an illustrative view illustrating one example of a power conversion system according to Third Embodiment.

FIG. 19 is an illustrative view (circuit block view) illustrating one example of a power conversion system (power conversion apparatus) according to the present embodiment.

The power conversion system illustrated in FIG. 19 has a load, such as a motor MOT, an inverter (amplifier circuit part) INV, a power supply BAT, a controller (control circuit) CTC, and photocouplers (optical coupling devices, optical coupling parts) PC. Herein, a three-phase motor is used as the motor MOT. A three-phase motor is configured to be driven by a voltage having three phases different from each other. The photocoupler PC is an optical coupling part to be inserted between an electrical circuit that forms the inverter INV and an electrical circuit that forms the controller CTC. The photocoupler PC has a function to electrically insulate the inverter INV and the controller CTC from each other and to transmit a signal from the controller CTC toward the inverter INV.

In the power conversion system in FIG. 19, the power supply BAT is to be coupled to the inverter INV such that a voltage (power) of the power supply BAT is supplied to the inverter INV. Alternatively, a voltage to be supplied to the inverter INV may be converted, or the coupling state between the power supply BAT and the inverter INV may be switched by interposing a non-illustrated converter or relay between the power supply BAT and the inverter INV.

The motor MOT is coupled to the inverter INV, so that a DC voltage (DC power) supplied from the power supply BAT to the inverter INV is converted into an AC voltage (AC power) by the inverter INV so as to be supplied to the motor MOT. The motor MOT is driven by the AC voltage (AC power) supplied from the inverter INV.

The controller CTC is also coupled to the inverter INV, so that the inverter INV is controlled by the controller CTC. That is, a DC voltage (DC power) is supplied from the power supply BAT to the inverter INV, which is converted into an AC voltage (AC power) by the inverter INV controlled by the controller CTC and then supplied to the motor MOT, thereby allowing the motor MOT to be driven. The controller CTC is formed, for example, by an ECU (Electronic Control Unit), and has a built-in controlling semiconductor chip, such as an MCU (Micro Controller Unit).

The inverter INV has six IGBTs (Insulated Gate Bipolar Transistors) 10, corresponding to three phase. That is, in each of the three phase, the IGBTs 10 are coupled between a power supply potential (VCC) supplied from the power supply BAT to the inverter INV and an input potential of the motor MOT, and between the input potential of the motor MOT and a ground potential (GND), respectively.

The motor MOT is to be driven (rotated) by controlling a current flowing through the IGBT 10 with the controller CTC. That is, the motor MOT can be driven by controlling ON/OFF of the IGBT 10 with the controller CTC.

In this case, if the inverter INV, through which a relatively large current for driving the motor MOT flows, and the controller CTC, through which a relatively small current, such as a control signal, flows, are electrically coupled together, there is the concern that noise may be caused on the controller CTC side.

So, by inserting the photocoupler PC, having a function to electrically insulate the inverter INV and the controller CTC from each other and to transmit a signal from the controller CTC toward the inverter INV, as illustrated in FIG. 19, the reliability of the power conversion system can be improved.

Further, by using the optical coupling device described in First Embodiment or Second Embodiment as the photocoupler PC to be used in the aforementioned power conversion system, the reliability of the power conversion system to be improved.

The invention made by the present inventors has been specifically described above based on preferred embodiments; however, it is needless to say that the invention should not be limited to the preferred embodiments and various modifications may be made to the invention within a range not departing from the gist of the invention. For example, a photocoupler is exemplarily described as an optical coupling device in First Embodiment; however, the resin described in First Embodiment may be applied to an optical MOSFET.

What is claimed is:

1. An optical coupling device comprising:
   a first element mounted over a first mounting part;
   a first lead electrically coupled to the first element;
   a first resin covering the first element;
   a second element mounted over a second mounting part;
   a second lead electrically coupled to the second element; and
   a second resin arranged between the second element and the first resin,
   wherein the second resin is a cured product of a composition having an epoxy resin and a curing agent, and has a light transmission property,
   wherein the second resin contains an aromatic ring and an alicyclic compound,
   wherein the cured product of the second resin includes silica in a ratio of 60 to 90 wt % based on the weight of the epoxy resin composition, and
   wherein the cured product is a compound represented by the formula:

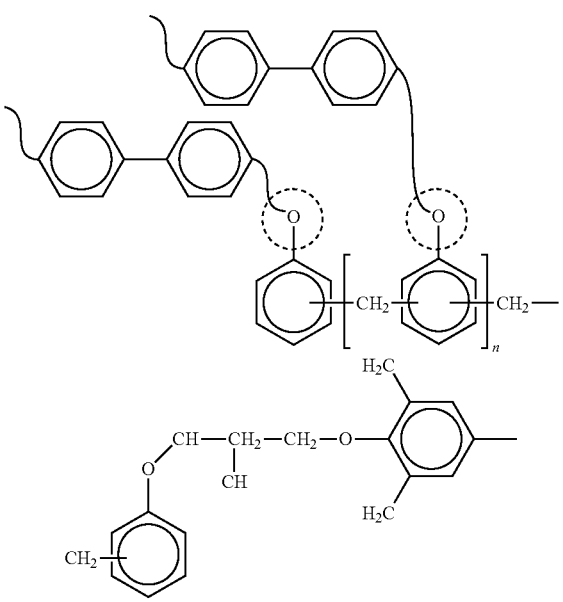

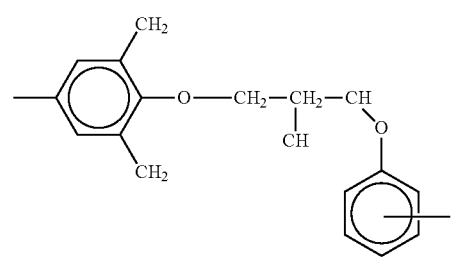

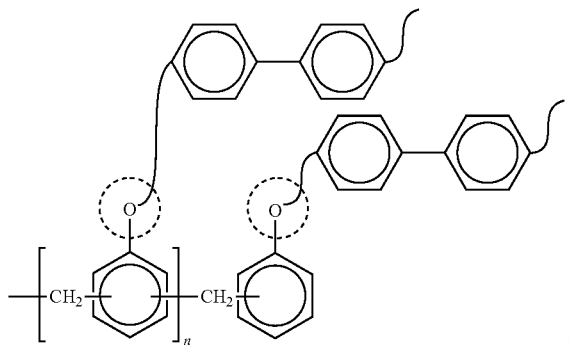

2. The optical coupling device according to claim 1, wherein the second resin excludes an aromatic ring.

3. The optical coupling device according to claim 1, wherein the epoxy resin is an epoxy resin represented by the formula (1):

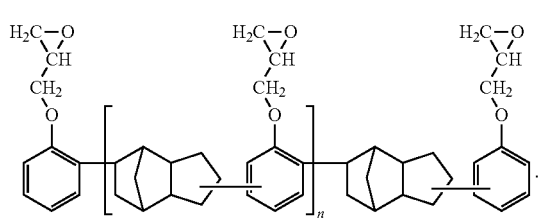
(1)

4. The optical coupling device according to claim 1, wherein the curing agent excludes an aromatic ring, and wherein the curing agent is represented by the formula:

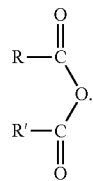

5. The optical coupling device according to claim 1, wherein the first resin is a silicone resin cured product.

6. The optical coupling device according to claim 1, wherein a transmittance per mm of a thickness of the second resin is 10% or more for light having a wavelength within a range of 700 nm to 1000 nm.

7. The optical coupling device according to claim 1, wherein a reflectance per mm of the thickness of the second resin is 90% or less for light having a wavelength within a range of 700 nm to 1000 nm.

8. A manufacturing method of an optical coupling device, comprising the steps of:
(a) providing both a first lead frame having a first mounting part and a first lead and a second lead frame having a second mounting part and a second lead;
(b) mounting a first element over the first mounting part;
(c) forming a first resin over the first element;
(d) mounting a second element over the second mounting part; and
(e) facing the first resin over the first element and the second element with each other so as to form a second resin between the second element and the first resin,
wherein the second resin is a cured product of a composition having an epoxy resin and a curing agent, and has a light transmission property,
wherein the epoxy resin contains an aromatic ring and an alicyclic compound,
wherein the cured product of the second resin includes silica in a ratio of 60 to 90 wt % based on the weight of the epoxy resin composition, and
wherein the cured product is a compound represented by the formula:

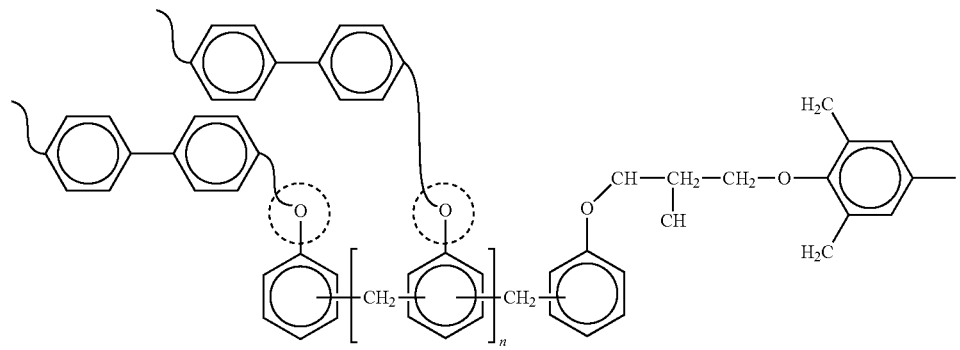

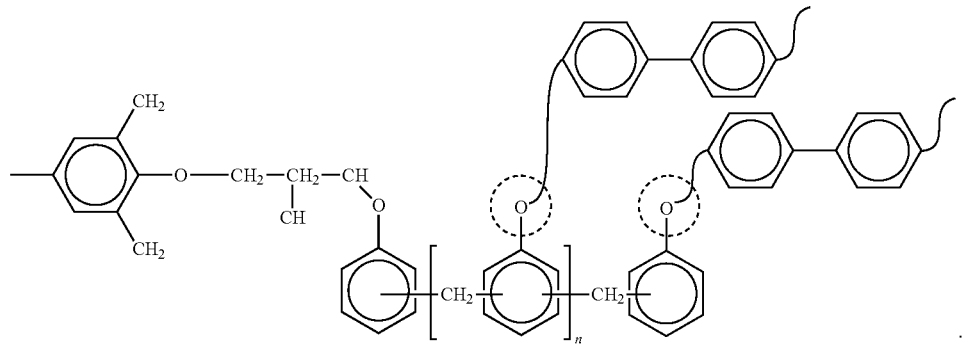

9. The manufacturing method of an optical coupling device according to claim 8,
wherein the (e) step is a step of forming the second resin by thermally curing the epoxy resin with the curing agent.

10. The manufacturing method of an optical coupling device according to claim 8,
wherein the epoxy resin excludes an aromatic ring.

11. The manufacturing method of an optical coupling device according to claim 8,
wherein the epoxy resin is an epoxy resin represented by the formula (1):

[Chemical Formula 8]

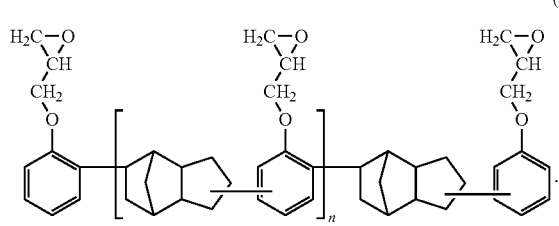

(1)

12. The manufacturing method of an optical coupling device according to claim 11,
wherein the curing agent excludes an aromatic ring.

13. The manufacturing method of an optical coupling device according to claim 8,
wherein the first resin is a silicone resin cured product.

14. The manufacturing method of an optical coupling device according to claim 8,
wherein a transmittance per mm of a thickness of the second resin is 10% or more for light having a wavelength within a range of 700 nm to 1000 nm.

15. The manufacturing method of an optical coupling device according to claim 8,
wherein a reflectance per mm of the thickness of the second resin is 90% or less for light having a wavelength within a range of 700 nm to 1000 nm.

16. A power conversion system comprising an amplifier circuit part and an optical coupling part to be coupled to the amplifier circuit part,
wherein the optical coupling part has:
a first element mounted over a first mounting part;
a first lead electrically coupled to the first element;
a first resin covering the first element;
a second element mounted over a second mounting part;
a second lead electrically coupled to the second element; and
a second resin arranged between the second element and the first resin, and
wherein the second resin is a cured product of a composition having an epoxy resin and a curing agent, and has a light transmission property,
wherein the second resin contains an aromatic ring and an alicyclic compound,
wherein the cured product of the second resin includes silica in a ratio of 60 to 90 wt % based on the weight of the epoxy resin composition, and
wherein the cured product is a compound represented by the formula:

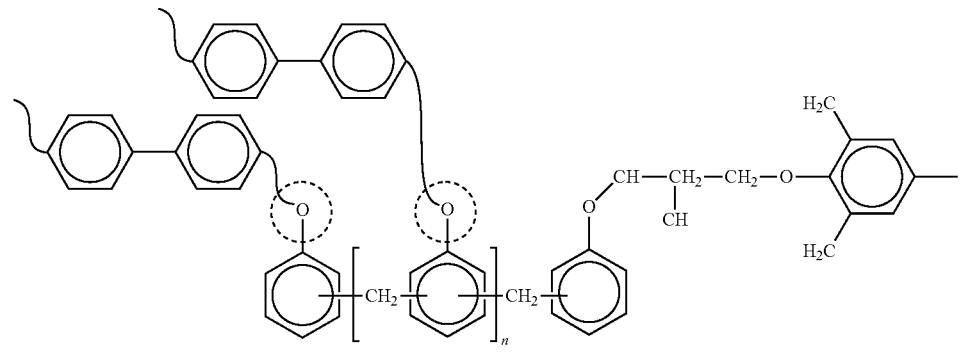

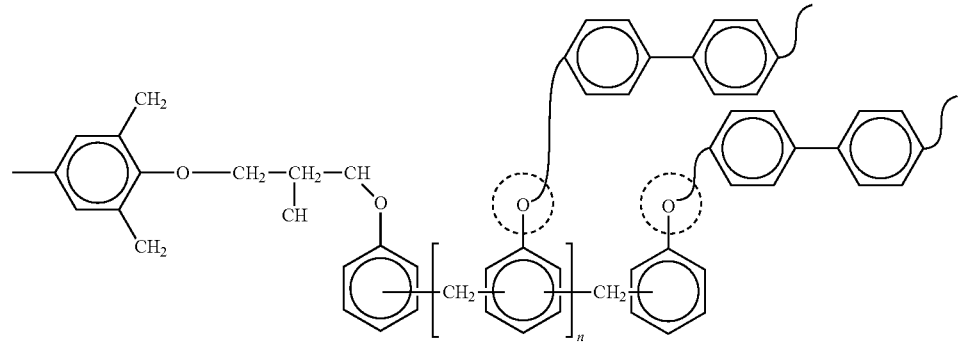

17. The power conversion system according to claim 16, wherein the curing agent excludes an aromatic ring, and wherein the curing agent is represented by the formula:
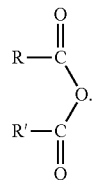
* * * * *